(12) United States Patent
Downes

(10) Patent No.: US 7,385,472 B1
(45) Date of Patent: Jun. 10, 2008

(54) MULTI-LEVEL PRINTED CIRCUIT BOARD INTERSTITIAL VIAS

(75) Inventor: Stuart D. Downes, Milford, MA (US)

(73) Assignee: EMC Corporation, Hopkinton, MA (US)

( * ) Notice: Subject to any disclaimer, the term of this patent is extended or adjusted under 35 U.S.C. 154(b) by 0 days.

(21) Appl. No.: 11/427,208

(22) Filed: Jun. 28, 2006

(51) Int. Cl.
*H01F 5/00* (2006.01)

(52) U.S. Cl. ...................... 336/200; 174/262
(58) Field of Classification Search ................. 336/200
See application file for complete search history.

(56) References Cited

U.S. PATENT DOCUMENTS 6,083,340 A * 7/2000 Nomura et al. ............. 156/253
6,632,512 B1 * 10/2003 Ito ............................. 428/210
2005/0244999 A1 * 11/2005 Masuyama et al. ......... 438/106

\* cited by examiner

*Primary Examiner*—Elvin Enad
*Assistant Examiner*—Joselito Baisa

(57) ABSTRACT

A printed circuit board having interstitial vias. The printed circuit board has a plurality of overlying electrical conductors disposed within an inner region of the printed circuit board. The overlying electrical conductors are separated by dielectric material. The printed circuit board has an aperture passing through a portion of the plurality of overlying electrical conductors printed circuit board. The overlying electrical conductors have ends with recesses therein. An electrical conductive via passes through the aperture with distal portions of the via projecting into the recesses.

10 Claims, 4 Drawing Sheets

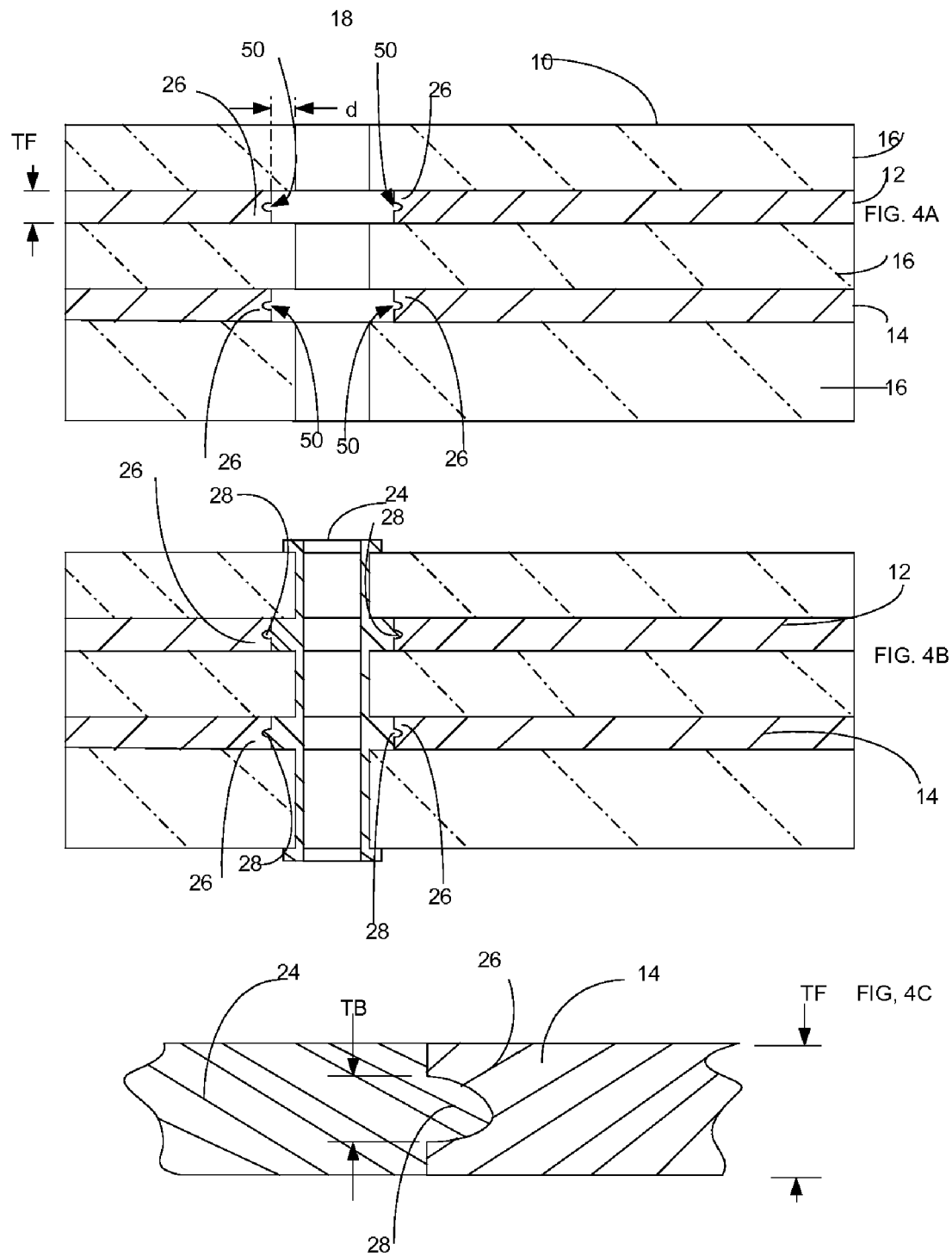

MULTI-LEVEL PRINTED CIRCUIT BOARD INTERSTITIAL VIAS

TECHNICAL FIELD

This invention relates generally to multi-level printed circuit boards and more particularly to printed circuit boards having interstitial vias.

BACKGROUND

As is known in the art, it is frequently required to make electrical contact from the upper surface of a multi-level printed circuit board to underlying electrical conductors within the board such as shown in FIG. 1A. Such connections are typically made by drilling a hole from the upper surface into the printed circuit board with such hole cutting through the desired underlying as shown in FIG. 1B. The walls of the hole are, after cleaning, coated with an electrically conductive material thereby forming an interstitial via, as shown in FIG. 1C.

Military products have often been processed with extreme positive or negative etch back features. The positive feature is produced by removing resin from the hole wall until the inner-layer copper foil (i.e., the underlying electrical conductor) protrudes as a tongue into the hole. Electro-less and anodic copper is then plated to the resin barrel on the via and also over-plates the protruding (so called positive) tongue. Negative etch back is produced by etching inner-layer copper foil away from the hole wall so that the edges of the foil are recessed inwardly from the walls of the drilled hole as shown in FIG. 2A. The electroless and anodic copper then penetrate the circumferential etch recess or groove, associated with each inner-layer foil plane, thus making a recessed interconnect as shown in FIG. 2B. Military standards also require rectangular interface structures with minimal copper wedge at the plane to via barrel transition. Positive and Negative Etch Back features are not typically found in commercial products. This is due to the yield and cost burden associated with the additional process requirements.

SUMMARY

In accordance with the present invention, a structure is provided comprising a printed circuit board having a plurality of overlying electrical conductors disposed within an inner region of the printed circuit board. The overlying electrical conductors are separated by dielectric material. The printed circuit board has an aperture passing through a portion of the plurality of overlying electrical conductors printed circuit board. The overlying electrical conductors have ends with recesses therein. An electrical conductive via passes through the aperture, distal portions of the via projecting into the recesses.

In accordance with another feature of the invention, a method is provided comprising: forming an aperture through a portion of a plurality of overlying electrical conductors of a printed circuit board, such aperture exposing ends of the electrical conductors; etching recesses in the ends of the overlying electrical conductors; and forming an electrical conductive via through the aperture with distal portions of the via projecting into the recesses.

Such structure and method is beneficial to application of micro-press-fit connectors as it improves pin to via retention force and reduces inner-layer copper dish-down defects in thin layer resin rich substrate constructions by increasing mechanical barrel bond strength and to deflect the compressive forces realized during component assembly.

The details of one or more embodiments of the invention are set forth in the accompanying drawings and the description below. Other features, objects, and advantages of the invention will be apparent from the description and drawings, and from the claims.

DESCRIPTION OF DRAWINGS

FIGS. 4A-4B show a multi-level printed circuit board at various stages in the formation of a conductive via therein according to another embodiment of the invention; and FIG. 4C shows an exploded region of a portion FIG. 4B.

Like reference symbols in the various drawings indicate like elements.

DETAILED DESCRIPTION

Figure 1A:
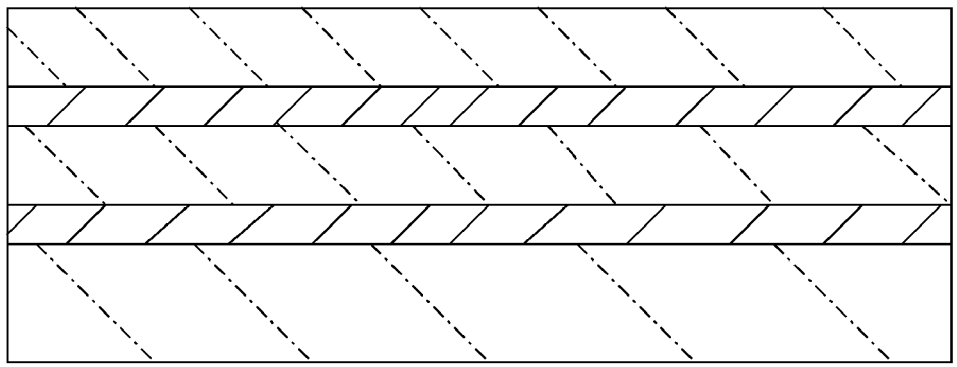
FIGS. 1A-1C show a multi-level printed circuit board at various stages in the formation of a conductive via therein according to the PRIOR ART.
Figure 1B:
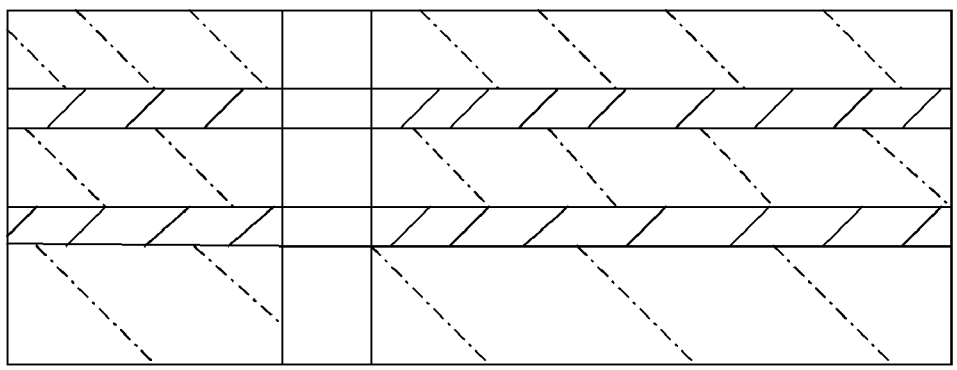
Figure 1C:
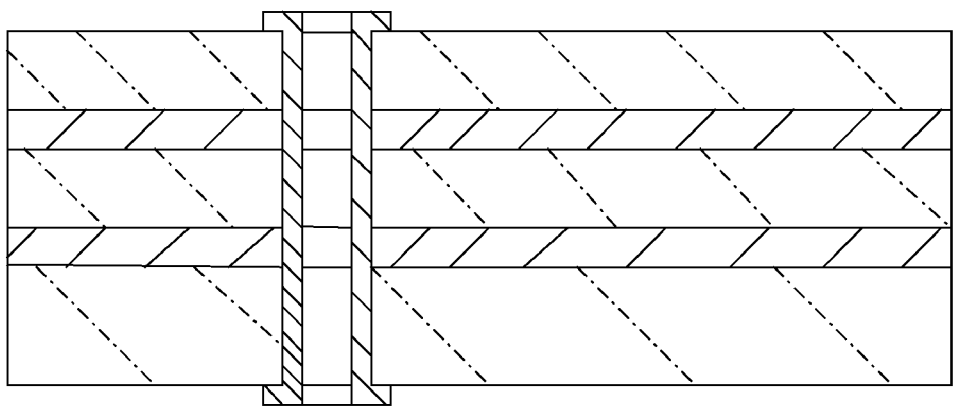
Figure 2A:
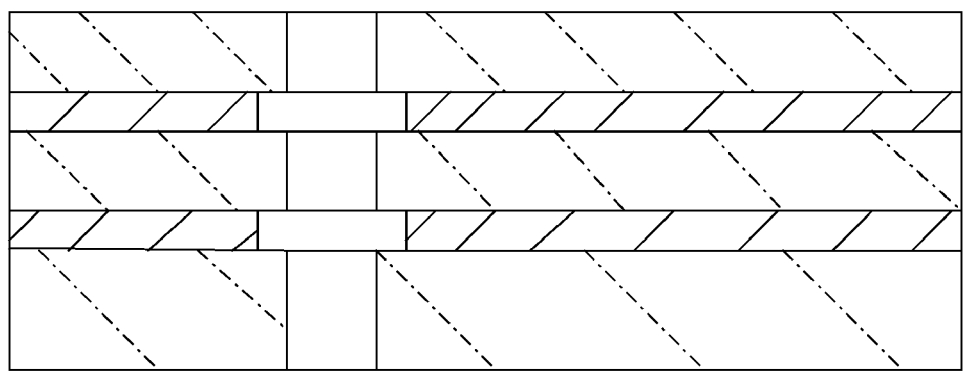
FIGS. 2A-2B show a multi-level printed circuit board at various stages in the formation of a conductive via therein according to the PRIOR ART.
Figure 2B:
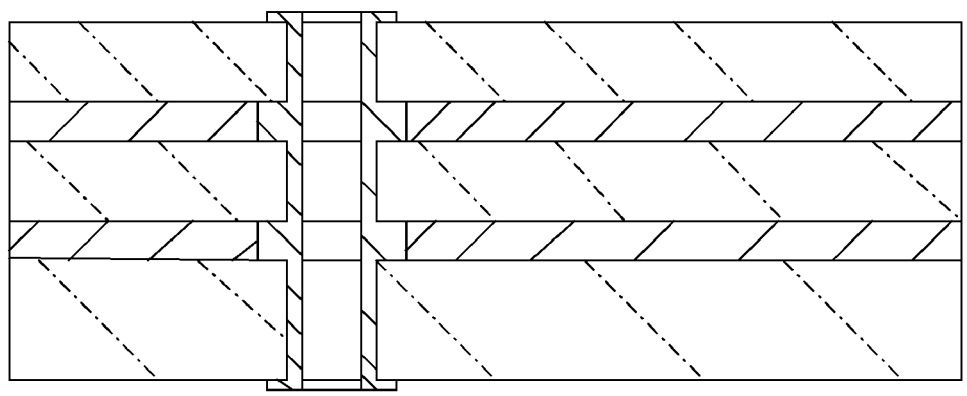
Figure 3A:
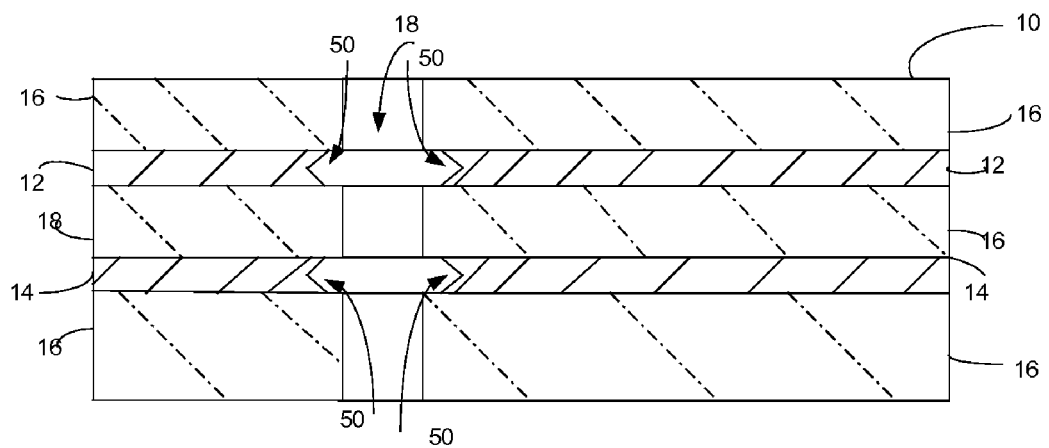
FIGS. 3A-3B show a multi-level printed circuit board at various stages in the formation of a conductive via therein according to the invention.
Figure 3B:
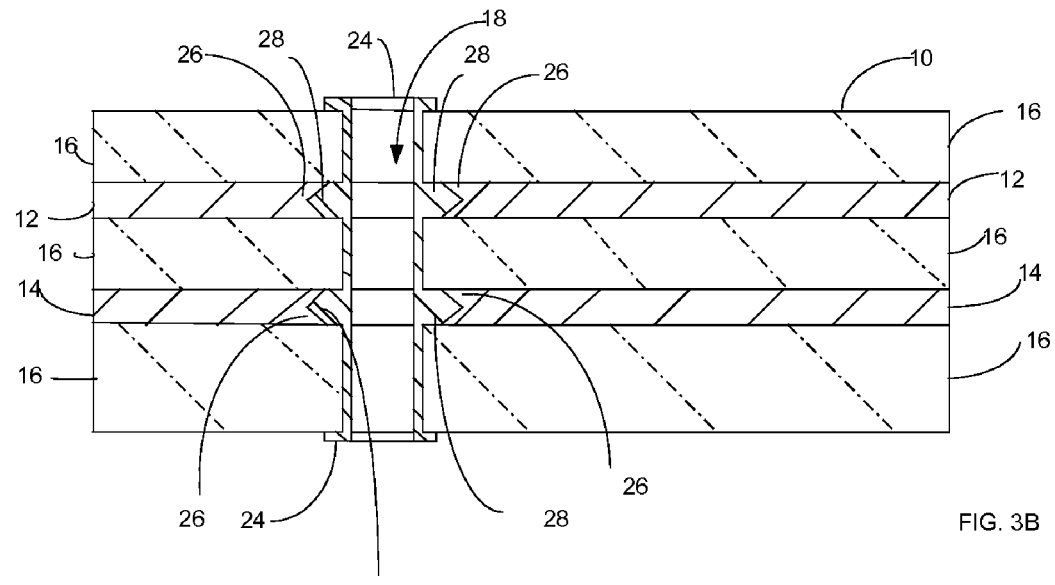

Referring now to FIG. 3B, a printed circuit board 10 is shown having a plurality of overlying electrical conductors (sometimes referred to as foils) 12, 14, here copper for example, disposed within an inner region of the printed circuit board. The overlying electrical conductors 12, 14 are separated by dielectric material 16. The printed circuit board 10 has an aperture 18 passing through a portion of the plurality of overlying electrical conductors 12, 14 and portions of the dielectric material 16, here a conventional dielectric resin) as shown. The overlying electrical conductors 12, 14 have ends 26 with recesses, shown more clearly in FIG. 3A as recesses 50 therein. An electrical conductive via 24 passes through the aperture 18 with distal portions 28 of the via projecting into the recesses 50 within ends 26.

The structure shown in FIG. 3B is formed as follows. Referring to FIG. 3A, the aperture 18 is drilled vertically through the printed circuit board 10; more particularly vertically through a portion of the plurality of overlying electrical conductors 12, 14 and vertically in-line portions of the aligned dielectric material 16. The aperture 18 thereby exposes ends 26 of the electrical conductors 14, 14.

Next, the sidewalls of aperture are de-smeared using any suitable materially, here, for example, permanganate or plasma.

Next, the walls are rinsed with water, for example.

Next, recesses 50 are etched into ends 26 of the overlying electrical conductors 12, 14. Here, the recesses are formed as follows: The recessed portion of the metallic undercut is obtained by exposing the product to a standard commercial blend enchant with a slow rate of metal removal. This enchant (here for example a sulphuric blend) is applied with minimal pressure and a slow rate of replenishment. This may be achieved by establishing such process parameters in a conventional etcher or immersing product in etching baths.

Process temperature, Ph, and pressures are conventional. The amount of groove undercut is a function of process time, and foil/copper thickness (cross-sectional innerlayer copper thickness).

Next, the aperture and the recesses are cleaned using, for example, an alkaline rinse, followed by a water rinse.

Next, a wet in-process transfer/buffer is used to inhibit further growth of harmful metallic oxide growth on copper surfaces. This may be achieved by fully immersing and storing product in portable baths of De-ionized water.

Next, the aperture and the recesses are catalyzed in any conventional manner, as for example with palladium chloride.

Next, the electrical conductive via 24 is formed through the aperture with distal portions of the via projecting into the recesses previously formed within ends 26. More particularly, the sidewalls of the aperture and the recesses are plated with copper using am electroless copper plate less than 0.000050 inches, followed by an electrolytic anodic copper plate at a rate of less than 0.001 inches per hour or more than 0.003 inches per hour, for example.

It is noted that the shape of the recesses within the ends 26 are shown wedged shaped in FIGS. 3A and 3B, they may be rounded as shown in FIGS. 4A and 4B. This is a function of the process when exposed to a thicker cross-sectional dimension such as 2 oz. Ground or Voltage Plane. It may also be achieved by sequential bath processing where fresh etchant tends too remove metal from the exposed faces of the feature and not wet enclosed shapes or material adjacent to resin when no working pressure is applied.

Thus, referring to FIGS. 4A-4C, the grooves 50 are again etched into ends 26 of the electrical conductors 14, 14 as described above in connection with FIGS. 3A-3B, but here shown more rounded. This more rounded shape is a process artifact produced by the standardized process chemistry, which is characterized on the predominant ½ oz. foil thickness within the product structure; to produce the mechanical feature shown as shape 50. When this standard wet chemistry interfaces with 2 oz foil it produces an artifact shape 28.

A 1 oz foils react with the chemistry to produce an acceptable transition shape with features similar to shape 50 and shape 28. Again the conductive via 24 is formed as described above in connection with FIG. 3B. Referring to FIG. 4C, the thickness of the electrical conductors 14, 14 are here TF. The span of the base of the rounded groove 50 is here TB. The distance of the etch back into the electrical conductor 14, 16 is indicated by "d". Typically, d is less than 50% TF but greater than 30% TF. TB is typically 50% maximum of TF but not less than 30% TF. Thus, d is between 30% TF and 50% TF while d is between 50% TF and 30% TF.

Prototypes of the structure shown in FIG. 3B have been fabricated with serial wet processes and copper etchants. The fabricated structures have been tested and show that reduced copper wedge artifacts are not detrimental to product reliability. Process data shows that standard continuous flow process conditions, applied to foils (i.e., the electrical conductors 12, 14) of 2 oz. through ½ oz. copper weight, produce a range of acceptable—though variable—wedge and negative groove (i.e., recesses in ends 26) conditions. Such a process, being automated and inline, makes application of these product features, by design, economically viable. The fabricated structures exhibit a 25-30% increase in mechanical bond strength of plated copper to hole-wall and innerlayer foil. This feature is beneficial to application of micro-press-fit connectors, not shown, that are inserted into the conductive vias as it improves pin to via retention force and reduces innerlayer copper dish-down defects in thin layer resin rich substrate constructions. These Interstitial characteristics are pertinent to application of micro-press-fit connectors. They reduce innerlayer pad neck down artifacts, in thin core substrates (less than 3.6 Mil dielectric Z-axis section), that may cause electrical shorts and interplay mechanically with press-fit connector pins. Such interplay has been shown to be detrimental to electrical continuity of the structure when the pin is insufficiently compliant, producing non-hermetic and non-contiguous interconnect regions.

It is noted that Foil (i.e., electrical conductor thickness) may be expressed in Oz. This is the weight of the copper foil per square foot in ounces. One Oz. is 0.0012"/0.0014" thick [1.2-1.4 Mils]. Therefore, ½ oz is roughly 0.0007" thick {7/10ths of a Mil} 20 Oz.=2.4-2.8 Mils etc.

Negative Etch Back Interstitial features benefit thin layer resin rich substrate structures (with or without micro-press-fit assemblies) to extend via life. This is measured by accelerated testing using high temperature high to low temperature thermal cycles. These temperature cycles induce mechanical stress, within the structure, due to physical differences in the rate of expansion and contraction between resin (i.e., dielectric material) and copper. This Interstitial Via topography also promotes visual inspection under visual/SEM analysis conditions. Electro-less micro-cracks often follow the resin-copper interface. When this is a vertically straight wall micro-cracks may be hidden by specimen polishing artifacts. The Negative Etch Back (NEB) feature provides a copper-to-copper interface that follows a contoured-rib profile; any crack that propagates therefore follows a multi-plane interface.

In forming the wedged shaped structure of FIG. 3B, a controlled and repeatable process there is a minimum amount of glass bundle tear, at the innerlayer to hole barrel transition, due to drilling. Etching the innerlayer foils back from the barrel internal diameter by 0.001" to 0.025" further erodes this interface as does subsequent resin de-smearing and catalization. This erosion, of a ninety degree resin to foil characteristic, creates a copper wedge pocket. The cross-sectional view of this wedge, in a maximum material condition, is typical of a 30 degree isosceles triangle. This is a limited and controlled wedge feature and is deemed not to be typical of gross wedge defects driven by non-controlled drilling and wet process fabrication operations.

A miniature but uniform copper wedge, that is non-porous and is part of a contiguous copper plated structure with copper to copper adhesion to the foil interface, will act in a uniform manner. Mechanically the wedge produces a "tongue-in-groove" structure. This structure significantly increases the surface contact area between foil and barrel coppers. This structure thereby will act like a leaf spring during expansion and contraction of the substrate in its Z-axis, thus increasing overall product reliability. Further, the blind vias are undercut and mechanically anchored at the base to a copper over-plated innerlayer base foil and the design methodology would significantly increase product life on Thin Core Multi-layer constructions in excess of 20 electrically conductive layers and in epoxy based laminates with Tg of 145-185 Degrees Centigrade (Tg: Glass Transition Temperature of the Laminated Resin System) and working temperatures typical of those used for Tin-Lead eutectic solders, and Tin-based solder alloys used to assemble when assembled and soldered at higher working temperatures to facilitate the use of non Lead bearing solder alloys.

A number of embodiments of the invention have been described. Nevertheless, it will be understood that various modifications may be made without departing from the spirit and scope of the invention. Accordingly, other embodiments are within the scope of the following claims.

What is claimed is:

1. A structure comprising:
   a printed circuit board having a plurality of overlying electrical conductors disposed within an inner region of the printed circuit board, such overlying electrical conductors being separated by dielectric material, such printed circuit board having an aperture passing through a portion of the plurality of overlying electrical conductors printed circuit board, such overlying electrical conductors having ends recessed from ends of the separating dielectric material a distance, d, and, such ends of the electrical conductors having notches therein projecting within inner regions of the conductors, such inner regions being disposed between upper and lower surfaces of the conductors;
   an electrical conductive via passing through the aperture, distal portions of the via projecting into the recesses; wherein each of the conductors has a thickness TF; and wherein the distance d is 30% to 50% TF.

2. The structure recited in claim 1 wherein the recesses comprise notches in the ends of the electrical conductors, wherein the notches have a base TB and wherein the base has a distance 30% TF to 50% TF.

3. A method comprising:
   forming an aperture through a portion of a plurality of overlying electrical conductors of a printed circuit board, such aperture exposing ends of the electrical conductors;
   etching recesses in the ends of the overlying electrical conductors, such recesses projecting from ends of the separating dielectric material a distance, d, and such ends of the conductors further being etched to have notches therein within inner regions of the conductors, such inner regions being disposed between upper and lower surfaces of the conductors;
   forming an electrical conductive via through the aperture with distal portions of the via projecting into the recesses; wherein each of the conductors has a thickness TF; and wherein the distance d is 30% to 50% TF.

4. The method recited in claim 3 wherein the plurality of overlying electrical conductors is disposed within an inner region of the printed circuit board, such overlying electrical conductors being separated by dielectric material.

5. The method recited in claim 3 wherein the recesses comprise notches disposed within the ends of the electrical conductors, wherein the notches have a base TB and wherein the base has a distance 30% TF to 50% TF.

6. A structure comprising:
   a printed circuit board having a plurality of overlying electrical conductors disposed within an inner region of the printed circuit board, such overlying electrical conductors being separated by dielectric material, such printed circuit board having an aperture passing through a portion of the plurality of overlying electrical conductors printed circuit board, such overlying electrical conductors having ends disposed between opposing surfaces of each one of the electrical conductors, each one of such ends having being recessed from ends of the separating dielectric material a distance, d, and such ends of the electrical conductors having notches therein, such recess projecting within an inner region of the conductor, such inner region being disposed between upper and lower surfaces of the conductor, such recess terminating between said opposing surfaces;
   an electrical conductive via passing through the aperture, distal portions of the via projecting into the recess; wherein each of the conductors has a thickness TF; and wherein the distance d is 30% to 50% TF.

7. The structure recited in claim 6 wherein the recess comprises a notch in the ends of the electrical conductors, wherein the notches have a base TB and wherein the base has a distance 30% TF to 50% TF.

8. A method comprising:
   forming an aperture through a portion of a plurality of overlying electrical conductors of a printed circuit board, such aperture exposing ends of the electrical conductors;
   etching recesses in the ends of the overlying electrical conductors, such recesses terminating between opposing surface portions of the electrical conductors, such recesses projecting within inner regions of the conductors;
   forming an electrical conductive via through the aperture with distal portions of the via projecting into the recesses; wherein each of the conductors has a thickness TF; and wherein the distance d is 30% to 50% TF.

9. The method recited in claim 8 wherein the plurality of overlying electrical conductors is disposed within an inner region of the printed circuit board, such overlying electrical conductors being separated by dielectric material.

10. The method recited in claim 8 wherein the recesses comprise notches disposed within the ends of the electrical conductors, wherein the notches have a base TB and wherein the base has a distance 30% TF to 50% TF.

* * * * *